United States Patent [19]

Akado

[11] Patent Number: 4,978,856
[45] Date of Patent: Dec. 18, 1990

[54] AUTOMATIC FOCUSING APPARATUS

[75] Inventor: Seishi Akado, Tokyo, Japan

[73] Assignee: Jeol Technics Co., Japan

[21] Appl. No.: 331,651

[22] Filed: Mar. 31, 1989

[30] Foreign Application Priority Data

Apr. 1, 1988 [JP] Japan .................................. 63-80702

[51] Int. Cl.⁵ ............................................ H01J 37/26
[52] U.S. Cl. ................................... 250/310; 250/307; 250/397
[58] Field of Search ............... 250/306, 307, 310, 311, 250/396 R, 397

[56] References Cited

U.S. PATENT DOCUMENTS

| | | | |
|---|---|---|---|
| 3,937,959 | 2/1976 | Namae | 250/311 |
| 4,169,240 | 9/1979 | Anderson et al. | 250/356 R |
| 4,199,681 | 2/1980 | Namae | 250/396 R |
| 4,393,309 | 7/1983 | Norioka | 250/310 |
| 4,464,680 | 8/1984 | Yamanaka | 315/5.3 X |
| 4,514,634 | 4/1985 | Lawson | 250/310 |

Primary Examiner—Bruce C. Anderson

[57] ABSTRACT

In an automatic focusing apparatus according to the invention, a focusing lens is provided for focusing an electron beam which scans a specimen. Charged particles emanating from the specimen are then detected. The excitation current energizing the lens is varied in accordance with a sweep signal that changes linearly. The electron beam scans at each different value of the sweep signal. An evaluating signal is produced indicating the degree to which the focusing lens is focused. The excitation current supplied to the lens is set according to the output signal from the evaluating signal-producing means. The linearly swept excitation current is modulated with a periodic signal. Plural cases are determined where the evaluating signal assumes maximum values. In each case, the average value of the linearly swept signal is calculated. The excitation current is set to a value to be supplied to the focusing lens, corresponding to the average value. The focusing lens is energized with electric current having the set value to focus the beam onto the specimen.

16 Claims, 4 Drawing Sheets

FIG.1
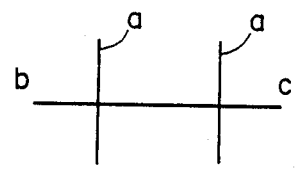
FIG.2
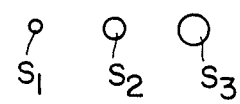
FIG.3(a)    FIG.3(b)    FIG.3(c)
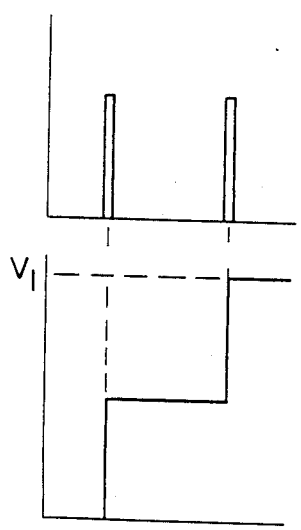 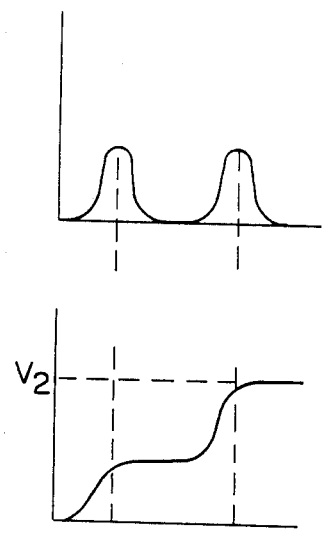 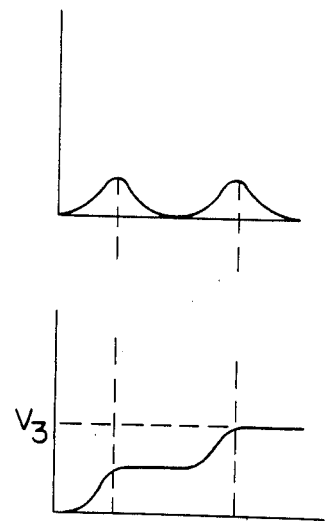
FIG.3(d)    FIG.3(e)    FIG.3(f)

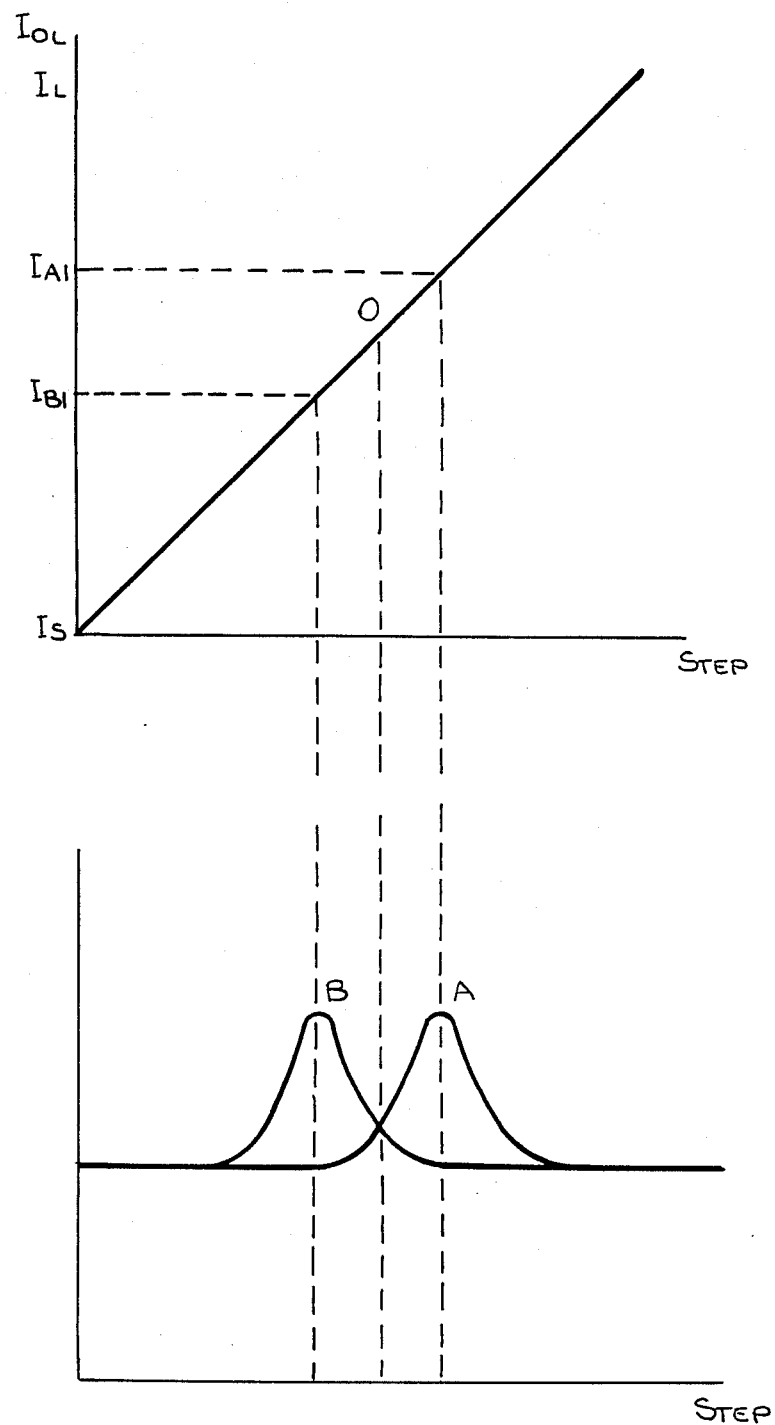

AUTOMATIC FOCUSING APPARATUS

BACKGROUND OF THE INVENTION

Field of the Invention

This invention relates to an apparatus for use in, for example, a scanning electron microscope or the like to focus an electron beam automatically.

In order to obtain a high-resolution image of a specimen by a scanning electron microscope or other similar instrument, it is necessary to illuminate the specimen with an electron beam which is focused to a very small spot. To focus the beam, the operator usually adjusts the focal length of the condenser lens, relying on his or her visual sense, i.e., while watching an electron micrograph. This adjustment is quite cumbersome and time-consuming for the operator to make.

In recent years, in an attempt to solve the foregoing problem, an apparatus for automatically focusing the beam has been proposed. This apparatus is shown in FIG. 1, where straight region a are formed on the surface of a specimen. The specimen is irradiated with an electron beam of a given intensity. It is assumed that the amount of signal emanating from the regions a is 1 and that the amount of signal produced from the other region is 0.

Referring next to FIG. 2, the specimen is scanned from a point b to a point c (FIG. 1) with electron beams focused to spots $S_1$, $S_2$, $S_3$, respectively. The resulting particles are detected, and the produced signals are shown in FIGS. 3(a), 3(b), and 3(c), respectively. Comparison of these graphs shows that scanning the specimen with the most sharply focused electron beam produces a signal which has the greatest amplitude and rises most rapidly, and that focusing the beam to a spot of a greater diameter makes the waveform of the resulting signal flatter. Integrating the signals shown in FIGS. 3(a), 3(b), 3(c) only in a positive direction gives rise to values $V_1 V_2$, $V_3$, shown in FIGS. 3(d), 3(e), 3(f), respectively. It is found that these values satisfy the relations $V_1 > V_2 > V_3$. That is, when the focusing lens is in focus, a maximum integration value is obtained. An integration value derived when the focusing lens is at a certain focal distance is compared with integration values obtained at different focal distances, and the electric current energizing the lens is so controlled as to produce a maximum integration value. Thus, automatic focusing is achieved.

An apparatus as disclosed in U.S. Pat. No. 3,937,959 operates as in the above-described principle. In particular, whenever a specimen is scanned, for example horizontally, with an electron beam, the excitation current supplied to the focusing lens is varied. The signal obtained from the specimen during each scan is integrated as described above. The excitation current at the time the maximum integration value is obtained is supplied to the focusing lens as an ideal excitation current, whereby the focusing lens comes to focus.

This automatic focusing operation has a drawback as described now. As shown in FIG. 4(a), when an excitation current $I_{OL}$, which changes linearly from $I_S$ to $I_l$ with respect to time t, is supplied to a focusing lens, a point at which a maximum integration value is obtained lags behind a focal point 0 by the effects of the hysteresis of the focusing lens and other phenomena. More specifically, in this operation, when the excitation current fed to the focusing lens varies from the minimum value $I_S$ to the maximum value $I_L$, the peak point lags as indicated by A in FIG. 4(b). When the excitation current changes from the maximum value $I_L$ to the minimum value $I_S$, the peak point appears after some delay as indicated by B in FIG. 4(b).

To avoid this problem, the following countermeasure has been taken. When the excitation current furnished to the focusing lens changes from the minimum value $I_S$ to the maximum value $I_l$, an excitation current value $I_A$, at which a maximum integration value is obtained, is found. Then, the excitation current is varied from the maximum value $I_L$ to the minimum value $I_S$. During this process, an excitation current value $I_B$ at which a maximum integration value is produced is found. The average of these two current values $I_A$, $I_B$ is used as an ideal excitation current value which brings the lens into focus. The lags of the peak values do not always coincide because of the hysteresis of the focusing lens. Therefore, the average value does not always agree with the ideal value which results in a focused condition. To set the excitation current value more accurately, the following several steps are carried out.

In the first step, the excitation current fed to the focusing lens is changed from the minimum value $I_S$ to the maximum value $I_L$, for example, in a stepwise fashion so that it takes $2^8$ different values. An excitation current value $I_{B1}$ at which a maximum integration value is obtained is found. Then, the excitation current is varied from the maximum value to the minimum value. During this process, an excitation current value $I_{A1}$ at which a maximum integration value is obtained, is found. In the next step, the excitation current value is changed from $I_{B1}$ to $I_{A1}$ in a stepwise fashion so that it takes $2^8$ different values. During this process, an excitation current value $I_{B2}$ at which a maximum integration value is derived is found. Then, the current value is varied from $I_{A1}$ to $I_{B1}$. At this time, an excitation current value $I_{A2}$ at which a maximum integration value is obtained is found. Several similar operations are performed such that the difference between the two excitation current values obtained in each step is reduced, to find an ideal excitation current value which brings the lens into focus.

In the above-described method, several similar steps must be carried out and so it takes a quite long time to appropriately set the excitation current value, for bringing the focusing lens into focus.

SUMMARY OF THE INVENTION

It is an object of the invention to provide an automatic focusing apparatus capable of automatically focusing a lens accurately and rapidly.

An automatic focusing apparatus for a scanning device comprises: a focusing lens for focusing an electron beam onto a specimen; an excitation power supply for energizing the lens; a scanning means for scanning a specimen with the electron beam; a detecting means for detecting charged particles emanating from the specimen when the specimen is scanned with the electron beam; a sweeping means for sweeping the excitation current supplied from the excitation power supply to the focusing lens in accordance with a linearly changing sweep signal; a control means enabling the scanning means to scan the electron beam when the sweep signal assumes a different value; and an evaluating signal-producing means for processing the output signal from the detecting means and producing an evaluating signal indicating the degree to which the focusing lens is brought into focus. The excitation current supplied to the focusing lens is set in accordance with the output signal from the evaluating signal-producing means. The apparatus further comprising a modulating and control means. The modulating means modulates the linearly swept excitation current from the excitation power supply with a periodic signal. The control means determines occurrences when the evaluating signal assumes maximum values. The control means calculates an average value of the linearly swept signal for each occurrence, and sets an excitation current value to be supplied to the focusing lens in accordance with the average value.

BRIEF DESCRIPTION OF THE DRAWINGS

FIGS. 1, 2, 3(a), 3(b), 3(c) are diagrams showing the relations of electron beam diameters to the waveforms of signals obtained from a specimen;

FIGS. 3(d), 3(e), and 3(f) are diagrams showing the integrated values of FIGS. 3(a), 3(b) and 3(c), respectively.

FIG. 4(a) is a diagram of the waveform of an excitation current produced during a conventional automatic focusing operation;

FIG. 4(b) is a diagram of waveforms obtained by integrating signals obtained from a specimen during the conventional automatic focusing operation;

DESCRIPTION OF THE PREFERRED EMBODIMENT

The theory underlying the inventive concept is first described. An excitation current is swept in accordance with a sweep signal that changes linearly with time. The excitation current is modulated with a periodic signal and supplied to an objective lens. Since the linearly changing sweep current is modulated, the excitation current fed to the objective lens alternately increases and decreases at short intervals. The charged particles emanating from the specimen are detected, and the resulting signal is integrated. Numerous peak points at which the integrated signal takes a maximum value occur with delays. The average is taken of the values assumed by the linearly changing sweep signal, corresponding to the numerous peaks. The objective lens is energized with the excitation current corresponding to the computed average value. Consequently, the objective lens is brought into focus accurately with a high degree of probability.

Figure 5:
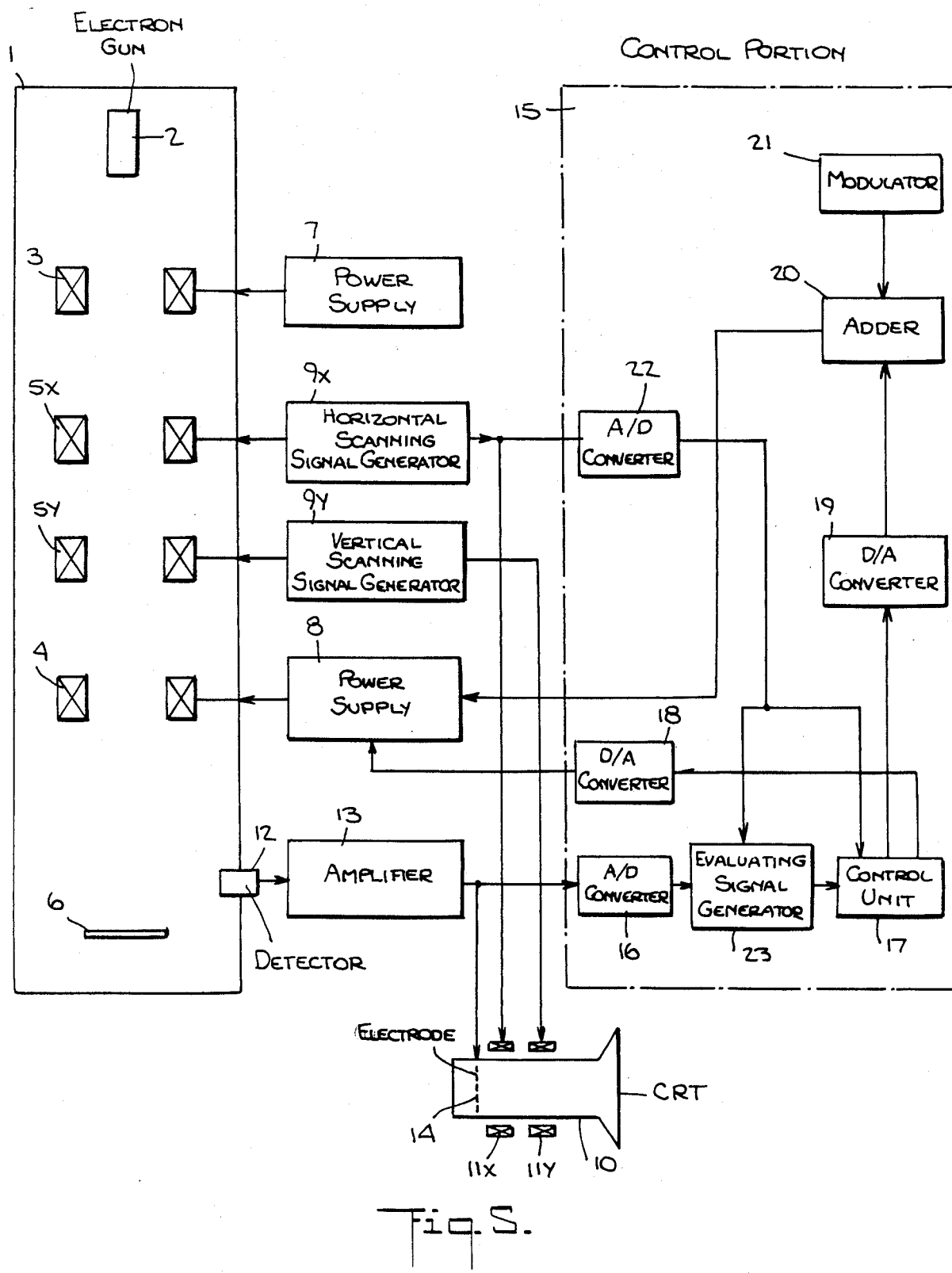
FIG. 5 is a block diagram of an automatic focusing apparatus for use in a scanning electron microscope, the apparatus being fabricated in accordance with an embodiment of the invention.

Referring to FIG. 5, there is shown an automatic focusing apparatus for use in a scanning electron microscope, the apparatus being built in accordance with an embodiment of the invention. The microscope has a microscopic column 1 defining an electron optical system. An electron gun 2, a first condenser lens 3, a second condenser lens (or objective lens) 4, a horizontal deflection coil 5X, and a vertical deflection coil 5Y are mounted in the column 1. Also, a specimen 6 is placed in the column 1. The first condenser lens 3 is energized with electric current supplied from a power supply 7. The objective lens 4 is energized with electric current supplied from a power supply 8. A horizontal scanning signal generator 9X produces a horizontal scanning signal which is supplied to the horizontal deflection coil 5X and also to the horizontal deflection coil 11X of a cathode-ray tube 10 simultaneously. A vertical scanning signal generator 9Y produces a vertical scanning signal in synchronism with the horizontal scanning signal generator 9X. The vertical scanning signal from the generator 9Y is fed to the vertical deflection coil 5Y and the vertical deflection coil 11Y of the CRT 10. The electron beam produced by the gun 2 is focused onto the specimen by the action of the lenses 3 and 4 which are energized by the power supplies 7 and 8, respectively. The beam is caused to make a two-dimensional scan on the specimen by the deflection coils 5X and 5Y. As a result, secondary electrons and reflected electrons are produced from the specimen. The electrons are detected by a detector 12. The output signal from the detector 12 is applied to the brightness-modulating electrode 14 of the CRT 10 via an amplifier 13. In the CRT 10, the electron beam is scanned across the viewing screen of the CRT in synchronism with the aforementioned scan to display an image of the specimen on the screen.

Figure 6A:
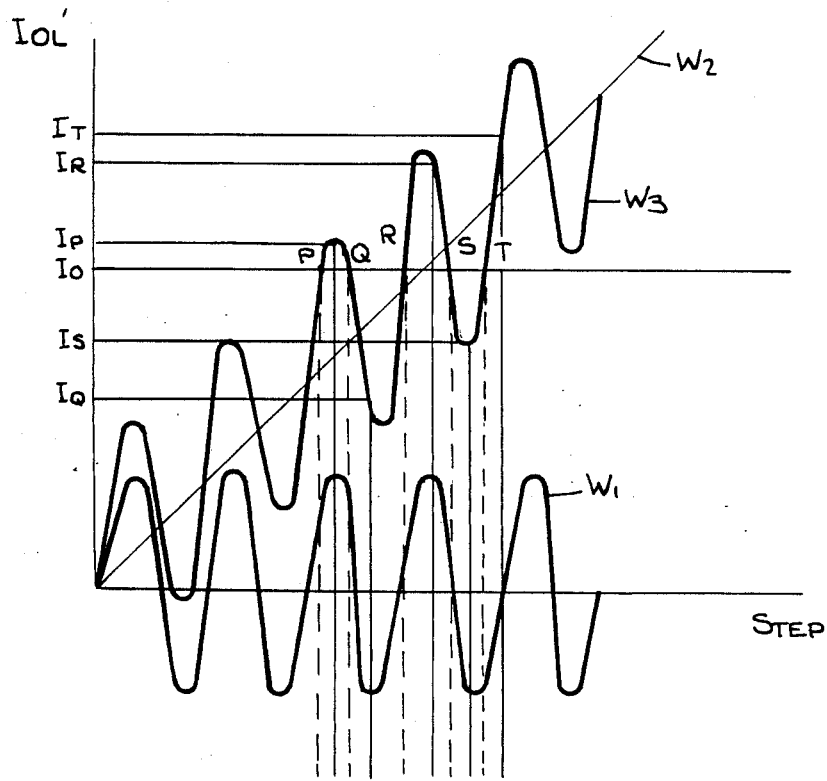
FIG. 6(a) is a diagram of the waveform of an excitation current produced during an automatic focusing operation according to an embodiment of the invention.

The objective lens 4 is energized with electric current supplied from the power supply 8, which is controlled by a control portion 15. This control portion 15 comprises an A/D converter 16, a control unit 17, D/A converters 18, 19, an adder circuit 20, a modulator circuit 21, an A/D converter 22, and an evaluating signal-generating circuit 23. The control unit 17 supplies a digital sweep signal to the D/A converter 19 to vary the excitation current fed to the objective lens 4 in such a way as to change linearly in increments as a step number is increased. Each time the electron beam makes one horizontal scan, the step number increases by one, and the excitation current is swept linearly. The modulator circuit 21 includes an oscillator to supply a sinusoidal signal to the adder circuit 20. The sinusoidal signal from the modulator circuit 21 is indicated by $W_1$ is FIG. 6(a). The linear signal from the D/A converter 19 is indicated by $W_2$ in FIG. 6(a). The adder circuit 20 produces the sum of the sinusoidal signal $W_1$ and the linear signal $W_2$. The sum signal is fed to the excitation power supply 8. The modulator circuit 21 produces a sinusoidal signal whose amplitude or frequency is so adjusted such that the sum signal assumes the same value many times. The excitation current from the excitation power supply 8 is controlled by the modulated signal $W_3$ shown in FIG. 6(a) and, therefore, the objective lens 4 is energized with an excitation current $I_{OL}$ having a waveform corresponding to the modulated signal $W_3$.

The output signal from the detector 12 is fed to the evaluating signal-generating circuit 23 via the amplifier 13 and the A/D converter 16 each time the electron beam makes a scan as mentioned already. The evaluating signal-generating circuit 23 integrates its input signal. The output signal from this circuit 23 is sent to the control unit 17, which then stores its input signal, corresponding to the step number (or sweep signal value) given to the digital sweep signal. After the excitation current is swept within a given range, the control unit 17 selects the maximum values from the stored integration values. The maximum values are plural in number, because plural local maxima take the same value. The control unit 17 finds step numbers corresponding to these maximum values and find linearly changing sweep signal values corresponding to the average value of these step numbers. The control unit 17 also acts to supply a control signal to the excitation power supply 8 via the D/A converter 18 such that the excitation current determined by the sweep signal value is fed to the objective lens 4 from the power supply 8.

Figure 6B:
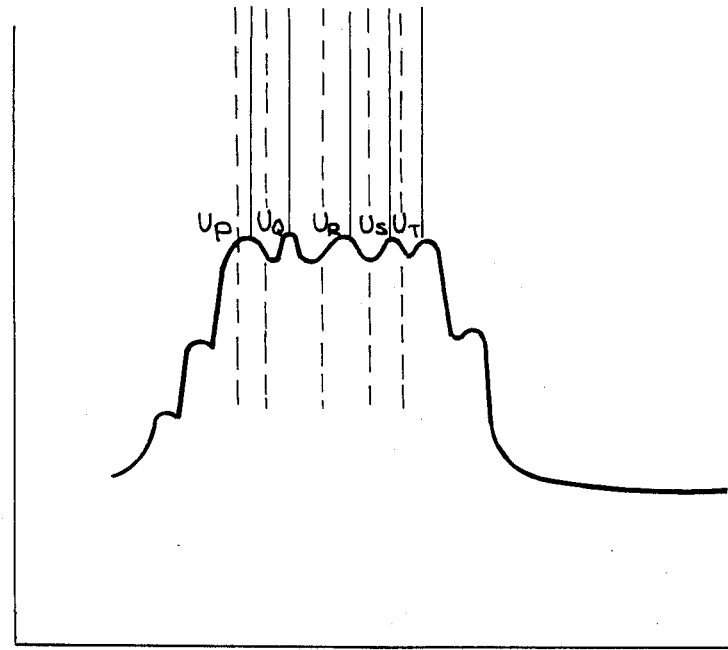
FIG. 6(b) is a diagram of the waveform produced by integrating a signal obtained from a specimen during an automatic focusing operation according to the invention.

It is now assumed that an excitation current having value $I_O$ which brings the objective lens into focus. When the power supply 8 supplies the excitation current $I_{OL}'$ having the waveform $W_3$ (FIG. 6(a)) to the objective lens 4, the current $I_{OL}'$ assumes the ideal current value $I_O$ at instants P, Q, R, S, and T. However, the signal which is supplied from the detector 12 to the circuit 23 via the amplifier 13 and the A/D converter 16 is exactly focused at instants of time slightly deviating from the instants P, Q, R, S, and T, respectively, by the effects of the hysteresis of the objective lens 4 and other phenomena. That is, the points at which the output signal from the evaluating signal-generating circuit assumes the maximum value lag behind as indicated by step numbers $U_P$, $U_Q$, $U_R$, $U_S$, $U_T$ in FIG. 6(b). The control unit 17 computes the average of the step number $U_P$, $U_Q$, $U_R$, $U_S$, $U_T$. The excitation current values respectively corresponding to the step numbers $U_P$, $U_Q$, $U_R$, $U_S$, $U_t$ are distributed around the ideal current value $I_O$ and so it is thought that the excitation current value determined according to the digital sweep signal values corresponding to this average is quite close to the ideal current value $I_O$. The control unit 17 stops the supply of the modulating signal to the adder circuit 20. Also, the control unit 17 supplies a control signal to the excitation power supply 8 via the D/A converter 18 so that an excitation current may be fed to the objective lens from the power supply 8. The excitation current has an amplitude determined in accordance with the digital sweep signal value corresponding to the average.

As described above, in accordance with an embodiment of the invention, while the excitation current supplied to the objective lens 4 to automatically bring it into focus is swept once, several excitation current values which give maximum integration values appear around the ideal current value $I_O$. Plural cases where these integration values are respectively maximum are found. The average of linearly changing sweep signal values in each case is calculated. An excitation current having a value corresponding to the average is fed to the focusing lens. Consequently, the automatic focusing operation is effected quickly.

In the above example, the linearly changing signal is modulated with the sinusoidal signal. This sinusoidal signal can be replaced with a rectangular wave signal. Also in the above example, the amount of change in the detector output signal in the forward direction is integrated. Alternatively, the detector output signal is differentiated in an analog manner, and then the area drawn by this signal is found to produce an evaluating signal. Also, it is possible to process signals otherwise, for evaluating the degree to which the lens is brought to focus.

Further in the above example, the amplitude of the sinusoidal signal is maintained constant. As a modified example, as the linearly changing sweep signal increases in amplitude, the amplitude of the sinusoidal signal is increased to maintain substantially constant the ratio of the amplitude of the sweep signal to the amplitude of the modulating signal. The terms "scanning electron microscope", "electron micrograph", "condenser lens", "electron beam" "focusing lens", "excitation current", "microscopic column", "electron optical system", "electron gun", "horizontal scanning signal generator", "horizontal deflection coil", "cathode ray tube", "vertical deflection coil", "vertical scanning signal generator", "secondary electrons", "reflected electrons", "detector", "brightness-modulating electrode", "A/D converter", "D/A converter", "adder circuit", "modulator circuit", "evaluating signal-generating circuit", "control unit", "oscillator" and other terms identifying features of the disclosed invention are each used generically; that is, the functional requirements that must be met by each of the elements identified by these terms will be apparent to one of ordinary skill in the art, and those terms accordingly are used throughout the specification and the claims to designate any element which meets such requirements.

The present invention is not limited to the details of the foregoing embodiments but includes various modifications within the scope and spirit of the appended claims.

WHAT IS CLAIMED IS:

1. An automatic focusing apparatus for a scanning device comprising a focusing lens for focusing an electron beam onto a specimen, a sweeping means for sweeping an excitation current to the focusing lens in accordance with a linearly changing sweep signal, and an evaluating signal-producing means for producing an evaluating signal indicating the degree to which the focusing leans is focused, said automatic focusing apparatus comprising:
    modulating means for modulating the linearly swept excitation current with a periodic signal; and
    control means for determining plural occurrences when the evaluating signal assumes local maxima values, wherein said control means calculates an average value of the linearly swept signal for each of the respective occurrences of the local maxima values, and wherein said control means sets the excitation current value to be supplied to the focusing lens in accordance with the average value.

2. The automatic focusing apparatus according to 1, wherein the periodic signal comprises a sinusoidal signal.

3. The automatic focusing apparatus according to claim 2, wherein the periodic signal and the sweep signal each respectively increase in amplitude.

4. The automatic focusing apparatus according to 1, wherein the periodic signal comprises a triangular wave signal.

5. The automatic focusing apparatus according to claim 4, wherein the periodic signal and the sweep signal each respectively increase in amplitude.

6. A method for automatically focusing a scanning device comprising a focusing lens for focusing an electron beam onto a specimen, and excitation power supply for energizing the lens, a scanning means for scanning the specimen with the electron beam, a detecting means for detecting charged particles emanating from the specimen scanned by the scanning means, a sweeping means for sweeping the excitation current supplied from the excitation power supply to the focusing lens in accordance with a linearly changing sweep signal, an enabling means enabling the scanning means to scan the electron beam when the sweep signal assumes a different value, and an evaluating signal-producing means for processing the output signal from the detecting means and producing an evaluating signal indicating the degree to which the focusing lens is focused, the method comprising the steps of:

modulating the linearly swept excitation current from the excitation power supply with a periodic signal;

determining plural occurrences when the evaluating signal assumes local maxima values;

calculating an average value of the linearly swept signal for each of the respective occurrences of the local maxima values; and setting the excitation current value to be supplied to the focusing lens in accordance to the average value.

7. The method according to claim 6, wherein the periodic signal comprises a sinusoidal signal.

8. The method according to claim 7, wherein the periodic signal and the sweep signal each respectively increase in amplitude.

9. The method according to 6, wherein the periodic signal comprises a triangular wave signal.

10. The method according to claim 9, wherein the periodic signal and the sweep signal each respectively increase in amplitude.

11. An automatic focusing apparatus for a scanning device comprising a focusing lens for focusing an electron beam onto a specimen, a sweeping means for sweeping an excitation current to the focusing lens in accordance with a linearly changing sweep signal, and an evaluating signal-producing means for producing an evaluating signal indicating the degree to which the focusing lens is focused, said automatic focusing apparatus comprising:

modulator for modulating the linearly swept excitation current from the excitation power supply with a periodic signal; and controller for determining plural occurrences when the evaluating signal assumes local maxima values, wherein said controller calculates an average value of the linearly swept signal for each of the respective occurrences of the local maxima values, and wherein said controller sets the excitation current value to be supplied to the focusing lens in accordance with the average value.

12. The automatic focusing apparatus according to 11, wherein the periodic signal comprises a sinusoidal signal.

13. The automatic focusing apparatus according to claim 12, wherein the periodic signal and the sweep signal each respectively increase in amplitude.

14. The automatic focusing apparatus according to 11, wherein the periodic signal comprises a triangular wave signal.

15. The automatic focusing apparatus according to claim 14, wherein the periodic signal and the sweep signal each respectively increase in amplitude.

16. An automatic focusing apparatus for a scanning device comprising a focusing lens for focusing an electron beam onto a specimen, an excitation power supply for energizing the lens, a scanning means for scanning the specimen with the electron beam, a detecting means for detecting charged particles emanating from the specimen scanned by the scanning means, a sweeping means for sweeping the excitation current supplied from the excitation power supply to the focusing lens in accordance with a linearly changing sweep signal, an enabling means enabling the scanning means to scan the electron beam when the sweep signal assumes a different value, and an evaluating signal-producing means for progressing the output signal from the detecting means and producing an evaluating signal indicating the degree to which the focusing lens is focused, said automatic focusing apparatus comprising:

modulating means for modulating the linearly swept excitation current from the excitation power supply with a sinusoidal signal; and control means for determining plural occurrences when the evaluating signal assumes local maxima values, wherein said control means calculates an average value of the linearly swept signal for each of the respective occurrences of the local maxima values, and wherein said control means sets the excitation current value to be supplied to the focusing lens in accordance with the average value.

* * * * *